United States Patent [19]

Aoyagi et al.

[11] Patent Number: 5,025,450
[45] Date of Patent: Jun. 18, 1991

[54] SEMICONDUCTOR LASER DEVICE

[75] Inventors: Toshitaka Aoyagi; Takashi Motoda, both of Itami, Japan

[73] Assignee: Mitsubishi Denki Kabushiki Kaisha, Japan

[21] Appl. No.: 482,507

[22] Filed: Feb. 21, 1990

[30] Foreign Application Priority Data

Mar. 27, 1989 [JP] Japan .................................. 1-75706

[51] Int. Cl.⁵ .................................. H01S 3/19
[52] U.S. Cl. .......................... 372/46; 372/45
[58] Field of Search ............... 372/45, 46; 11/43

[56] References Cited

U.S. PATENT DOCUMENTS 4,667,332  5/1987  Mihashi et al. ................... 372/45
4,841,535  6/1989  Mihashi et al. ................... 372/46
4,849,372  7/1989  Takemoto ........................... 437/129

FOREIGN PATENT DOCUMENTS 47-8471  5/1972  Japan .
0021389  2/1983  Japan ................................... 372/46
0062177  4/1985  Japan ................................... 372/48

Primary Examiner—Georgia Epps
Attorney, Agent, or Firm—Leydig, Voit & Mayer

[57] ABSTRACT

A semiconductor laser device includes an active layer including a bent or a curved light emission portion which is bent or curved toward the device surface side or toward the substrate side, lower and upper cladding layers opposite sides of the active layer, and a diffusion region produced by diffusing impurities to a position within the lower cladding layer or the upper cladding layer forming a pn junction in the respective lower or upper cladding layer to direct current flow in the lower cladding layer into the part of the active layer emitting light.

14 Claims, 1 Drawing Sheet

SEMICONDUCTOR LASER DEVICE

FIELD OF THE INVENTION

The present invention relates to a semiconductor laser device and more particularly, to a laser that oscillate at a low threshold current.

BACKGROUND OF THE INVENTION

FIG. 2 shows a prior art semiconductor laser device having a bent active layer. In FIG. 2, reference numeral 1 designates a p type GaAs substrate. A $_p$ type AlGaAs buffer layer 2 is disposed on p type GaAs substate 1. An N type GaAs blocking layer 3 is disposed on p type AlGaAs buffer layer 2. A $_p$ type Al $_x$Ga $_{1-x}$As lower cladding layer 4 is disposed on n type GaAs blocking layer 3 and p type buffer layer 2. An undoped Al $_y$Ga $_{1-y}$As active layer 5 is disposed on lower cladding layer 4. An N type Al $_{x'}$Ga $_{1-x'}$As upper cladding layer 6 is disposed on active layer 5. An N type GaAs contact layer 7 is disposed on upper cladding layer 6. Reference numeral 8 designates effective current flow and reference numeral 9 designates noneffective current flow. Herein, x and x' are larger than y.

The device will operates as follows.

The current injected from the p type substrate 1 flows through the p type AlGaAs buffer layer 2 and further through the p type Al $_x$Ga $_{1-x}$As lower cladding layer 4, the updoped Al $_y$Ga $_{1-y}$As active layer 5, the n type Al $_{x'}$Ga $_{1-x'}$As upper cladding layer 6, and n type GaAs contact layer 7. Herein, current is not injected except at a bent portion of the undoped Al $_y$Ga $_{1-y}$As active layer 5 because n type GaAs current blocking layers 3 are located between the p type AlGaAs buffer layer 2 and the p type Al $_x$Ga $_{1-x}$As lower cladding layer 4. As a result, an effective current 8 is injected into the neighborhood of the bent portion of undoped Al $_y$Ga $_{1-y}$As active layer 5, producing laser oscillation.

In the prior art semiconductor laser device having a bent active layer, a portion of the current injected from the p type GaAs substrate 1 is not injected into the bent portion of undoped Al $_y$Ga $_{1-y}$As active layer 5 but is injected into the flat portion at the both sides of the bent portion as noneffective current 9, increasing the threshold current.

SUMMARY OF THE INVENTION

It is an object of the present invention to provide a semiconductor laser device oscillating at a low threshold current.

Other objects and advantages of the present invention will become apparent from the detailed description given hereinafter; it should be understood, however, that the detailed description and specific embodiment are given by way of illustration only, since various changes and modification within the spirit and the scope of the invention will become apparent to those skilled in the art from this detailed description.

According to an aspect of the present invention, impurities are diffused intermediate the lower or upper cladding layers not reaching the bent portion of active layer, thereby producing a region reverse in conductivity type to the conductivity of the lower or upper cladding layer. The pn junctions in the cladding layer produced by diffusing impurities obstructs noneffective current, thereby reducing the threshold current.

DETAILED DESCRIPTION OF THE PREFERRED EMBODIMENTS

An embodiments of the present invention will be described in detail with reference to the drawings.

Figure 1:
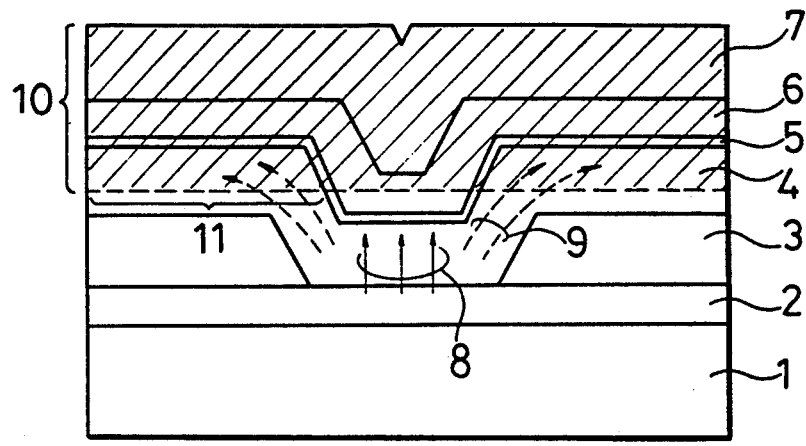
FIG. 1 is a cross-sectional view showing a semiconductor laser device according to an embodiment of the present invention.
Figure 2:
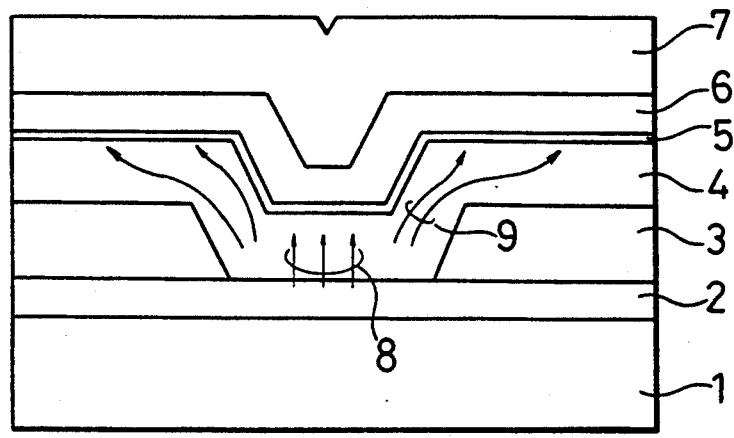
FIG. 2 is a cross-sectional view showing a semiconductor laser device according to the prior art.

FIG. 1 shows a semiconductor laser device according to a first embodiment of the present invention. In FIG. 1, the same reference numeral designate the same or corresponding elements shown in FIG. 2. Reference numeral 10 designates a Si diffusion region, and reference numeral 11 designates a pn junction having a high built-in potential.

The laser device will operate as follows.

The flow of current is almost the same as in the prior art device but is different as described below:

When current is injected into the undoped Al $_y$Ga $_{1-y}$As active layer 5 from the p type Al $_x$Ga $_{1-x}$As lower cladding layer 4, noneffective current 9 is not injected into the flat portion the side of the bent portion as in the prior art device. On the contrary, in the present embodiment, only effective current 8 is injected. In the present invention, Si is diffused into the surface opposite the substrate to produce a Si diffusion region 10 which is n type. Region 10 extends to a position within the p type Al $_x$Ga $_{1-x}$As lower cladding layer 4, and a pn junction 11 having a high built-in potential is produced within the p type Al $_x$Ga $_{1-x}$As lower cladding layer 4. This potential barrier is higher than the potential barrier of the p-i-n junction produced at the bent portion between the lower cladding layer 4, the undoped Al $_y$Ga $_{1-y}$As active layer 5, and the upper cladding layer 6 because x>y. Therefore, current (a noneffective current 9) is not likely to be injected into the flat portion at the side of the bent portion. Thus, a semiconductor laser device of low threshold current having reduced noneffective current 9 is realized.

While in the above-illustrated embodiment, a semiconductor laser device has an active layer which is bent in concave configuration toward the substrate, a semiconductor laser device having a curved active layer may be employed. Furthermore, a semiconductor laser device having an active layer which is bent in convex configuration or curved away from the substrate may be employed by diffusing dopant impurities from the substrate side into the upper cladding layer. Furthermore, dopants other than Si may be used for the diffusion. Furthermore, while in the above-illustrated laser device the cladding layers and active layer comprise AlGaAs series material, a semiconductor laser device comprising AlGaInP series or GaInAsP series materials may be employed.

As is evident from the foregoing description, according to the present invention, impurities producing a region of reverse conductivity type from that of the lower or upper cladding layer are diffused the lower or upper cladding layer from opposite the substrate side or the substrate side, whereby noneffective current flow is obstructed by the pin junction produced by diffusion the impurities and only effective current flows through the bent or curved portion of the active region, thereby enabling oscillation at a low threshold current.

What is claimed is:

1. In a semiconductor laser structure:
a substrate;
an active layer including a non-planar light-emitting portion supported by said substrate;
lower and upper cladding layers respectively disposed on opposite sides of said active layer; and
a diffusion region produced by diffusion impurities from the side of the device opposite the substrate to a position within said lower cladding layer, the impurities forming a pn junction within said lower cladding layer spaced from the light-emitting portion of the non-planar active layer.

2. The semiconductor laser structure as defined in claim 1, wherein said upper and lower cladding layers and said active layer comprise AlGaAs.

3. The semiconductor laser structure as defined in claim 1, wherein said upper and lower cladding layers and said active layer comprise AlGaInP.

4. The semiconductor laser structure as defined in claim 1, wherein said upper and lower cladding layers and said active layer comprise GaInAsP.

5. In a semiconductor laser structure:
a first conductivity type semiconductor substrate;
a discontinuous current blocking layer of a second conductivity type disposed on the substrate;
a first cladding layer disposed on the current blocking layer and on the substrate where the current blocking layer is discontinuous;
a non-planar active layer disposed on the first cladding layer;
a second cladding layer disposed on the active layer; and
a contacting layer of the second conductivity type disposed on the second cladding layer wherein a second conductivity type region extends from the contacting layer through a portion of the second cladding layer, a portion of the active layer, and a portion of the first cladding layer, forming a pn junction in a portion of the first cladding layer to direct current flow in the first cladding layer into a portion of the active layer.

6. The semiconductor laser structure as defined in claim 5 wherein the substrate includes a first conductivity type buffer layer on which the current blocking and first cladding layers are disposed.

7. The semiconductor laser structure as defined in claim 5 wherein the active layer includes a portion from which light is emitted that is concave relative to the substrate.

8. In a semiconductor laser structure:
a first conductivity type substrate;
a first cladding layer disposed on the substrate;
a non-planar active layer disposed on the first cladding layer;
a second cladding layer disposed on the active layer;
a discontinuous current blocking layer of a second conductivity type disposed on part of the second cladding layer; and
a second conductivity type contacting layer disposed on the current blocking layer and on the second cladding layer where the current blocking layer is discontinuous wherein a first conductivity type region extends from the substrate through a portion of the first cladding layer, a portion of the active layer, and a portion of the second cladding layer, forming a pn junction in a portion of the second cladding layer to direct current flow in the first cladding layer into a portion of the active layer.

9. The semiconductor laser structure as defined in claim 8 wherein the substrate includes a first conductivity type buffer layer on which the first cladding layers is disposed.

10. The semiconductor laser structure as defined in claim 8 wherein the active layer includes a portion from which light is emitted that is convex relative to the substrate.

11. In a semiconductor laser structure:
a substrate;
an active layer including a non-planar light-emitting portion supported by said substrate;
lower and upper cladding layers respectively disposed on opposite sides of said active layer; and
a diffusion region produced by diffusion impurities from the substrate side of the device to a position within said upper cladding layer, the impurities forming a pn junction within said upper cladding layer spaced from the light-emitting portion of the non-planar active layer.

12. The semiconductor laser structure as defined in claim 11 wherein said upper and lower cladding layers and said active layer comprise AlGaAs.

13. The semiconductor laser structure as defined in claim 11 wherein said upper and lower cladding layers and said active layer comprise AlGaInP.

14. The semiconductor laser structure as defined in claim 11 wherein said upper and lower cladding layers and said active layer comprise GaInAsP.

* * * * *

UNITED STATES PATENT AND TRADEMARK OFFICE
CERTIFICATE OF CORRECTION

PATENT NO. : 5,025,450

DATED : June 18, 1991

INVENTOR(S) : Aoyagi et al

It is certified that error appears in the above-identified patent and that said Letters Patent is hereby corrected as shown below:

Column 3, line 8, change (second occurrence) "diffusion" to --diffusing--;

Column 4, line 35, change (second occurrence) "diffusion" to --diffusing--.

Signed and Sealed this

Third Day of November, 1992

*Attest:*

DOUGLAS B. COMER

*Attesting Officer*  *Acting Commissioner of Patents and Trademarks*